United States Patent
Schneider et al.

(10) Patent No.: US 10,454,497 B1
(45) Date of Patent: Oct. 22, 2019

(54) REDUCING A SIZE OF MULTIPLE DATA SETS

(71) Applicant: Dell Products L. P., Round Rock, TX (US)

(72) Inventors: Brian Dale Schneider, Round Rock, TX (US); Roberto Angel Vallarino, Austin, TX (US)

(73) Assignee: Dell Products L. P., Round Rock, TX (US)

( * ) Notice: Subject to any disclaimer, the term of this patent is extended or adjusted under 35 U.S.C. 154(b) by 0 days.

(21) Appl. No.: 16/166,588

(22) Filed: Oct. 22, 2018

(51) Int. Cl.
*H03M 7/00* (2006.01)
*H03M 7/30* (2006.01)
*G06F 3/06* (2006.01)

(52) U.S. Cl.
CPC ........ *H03M 7/3088* (2013.01); *G06F 3/0608* (2013.01); *G06F 3/0629* (2013.01); *G06F 3/0673* (2013.01)

(58) Field of Classification Search
CPC ... H03M 7/3088; G06F 3/0608; G06F 3/0673
USPC ..................... 341/50, 51, 106, 107
See application file for complete search history.

(56) References Cited

U.S. PATENT DOCUMENTS

| | | | | |
|---|---|---|---|---|
| 5,990,810 A * | 11/1999 | Williams | ............. | G06F 3/0608 341/51 |
| 7,477,166 B2 * | 1/2009 | McCanne | ............. | H03M 7/30 341/50 |
| 8,156,071 B2 * | 4/2012 | Gu | ............. | G06F 16/10 717/100 |
| 8,244,046 B2 * | 8/2012 | Takahashi | ......... | G06F 16/90344 382/229 |
| 8,751,503 B2 * | 6/2014 | Sonoda | ................. | G06Q 10/06 707/739 |
| 2007/0150495 A1 * | 6/2007 | Koizumi | ................. | G06F 16/36 |
| 2013/0151957 A1 * | 6/2013 | Kuroiwa | ............. | G06F 17/2211 715/256 |

* cited by examiner

*Primary Examiner* — Peguy Jean Pierre
(74) *Attorney, Agent, or Firm* — Campbell Stephenson LLP; Shiv S. Naimpally

(57) ABSTRACT

A computing device may select a plurality of data sets, determine a set of strings that are included in at least two data sets of the plurality of data sets, and select a particular string of the set of strings. The computing device may replace each occurrence of the particular string in the plurality of data sets to create a modified plurality of data sets such that the modified plurality of data sets is smaller in size than the plurality of data sets. The computing device may assign a reference to the particular string and replace each occurrence of the particular string in the plurality of data sets to create a plurality of modified data sets. The computing device may replace may store the reference and the particular string in a table.

20 Claims, 4 Drawing Sheets

REDUCING A SIZE OF MULTIPLE DATA SETS

BACKGROUND OF THE INVENTION

Field of the Invention

This invention relates generally to data storage and, more particularly to reducing a size of multiple data sets stored in one or more databases.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Data is growing at an exponential rate. Storage capacity continually struggles to keep pace with the demand for data storage. As the amount of storage used increases, the cost to obtain the data storage may also increase. For example, a business may desire to store a large quantity of data for a particular period of time, such as twelve months (e.g., for legal or other purposes). As the amount of data increases, the business may have to choose between paying more money to purchase (or lease) additional storage space to accommodate the increased amount of data or reduce the amount of time that the data is stored, e.g., from twelve months to six months.

SUMMARY OF THE INVENTION

This Summary provides a simplified form of concepts that are further described below in the Detailed Description. This Summary is not intended to identify key or essential features and should therefore not be used for determining or limiting the scope of the claimed subject matter.

In some examples, a computing device may select multiple data sets. The computing device may determine a set of (e.g., one or more) strings that are included in (e.g., common to) at least two data sets of the multiple data sets. The computing device may select a particular string of the set of strings and may replace each occurrence of the particular string in the multiple data sets with a corresponding reference to create a plurality of modified data sets, such that at least one of the modified data sets is smaller in size than a corresponding (e.g., original) data set. The computing device may repeat this process (e.g., perform multiple passes) of (i) determining a set of strings that are included in each data set of the plurality of data sets, (ii) selecting a particular string from the set of strings, and (iii) replacing the occurrence of the particular string in the multiple data sets with a corresponding reference until a predetermined amount (or percentage) of reduction in size for each of the data sets (or a total size of the data sets) is achieved. In each successive pass, the resulting modified data sets (e.g., in which a particular string has been replaced by a reference) may be smaller in size than the size of the multiple data sets prior to replacing the particular string. The computing device, when determining the particular string of the set of strings, may determine (i) a frequency of occurrence of the string in each of the multiple data sets and (ii) a length associated with each string. In some cases, the computing device may (i) assign a first weight to the frequency and a second weight to the length of each string of the plurality of strings, (ii) determine a weighted score of each string of the plurality of strings based on the first weight and the second weight, and (iii) select the particular string from the plurality of strings that has a highest weighted score. Before replacing each occurrence of the particular string in the multiple data sets to create the plurality of modified data sets, the computer may assign a reference to the particular string. The computing device may replace each occurrence of the particular string in the multiple data sets with the reference. The computing device may store the reference and the particular string in a table. The reference may be an identifier (e.g., a number), a pointer, or another type of reference that is smaller in size than the particular string that the reference is replacing.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

Figure 1:
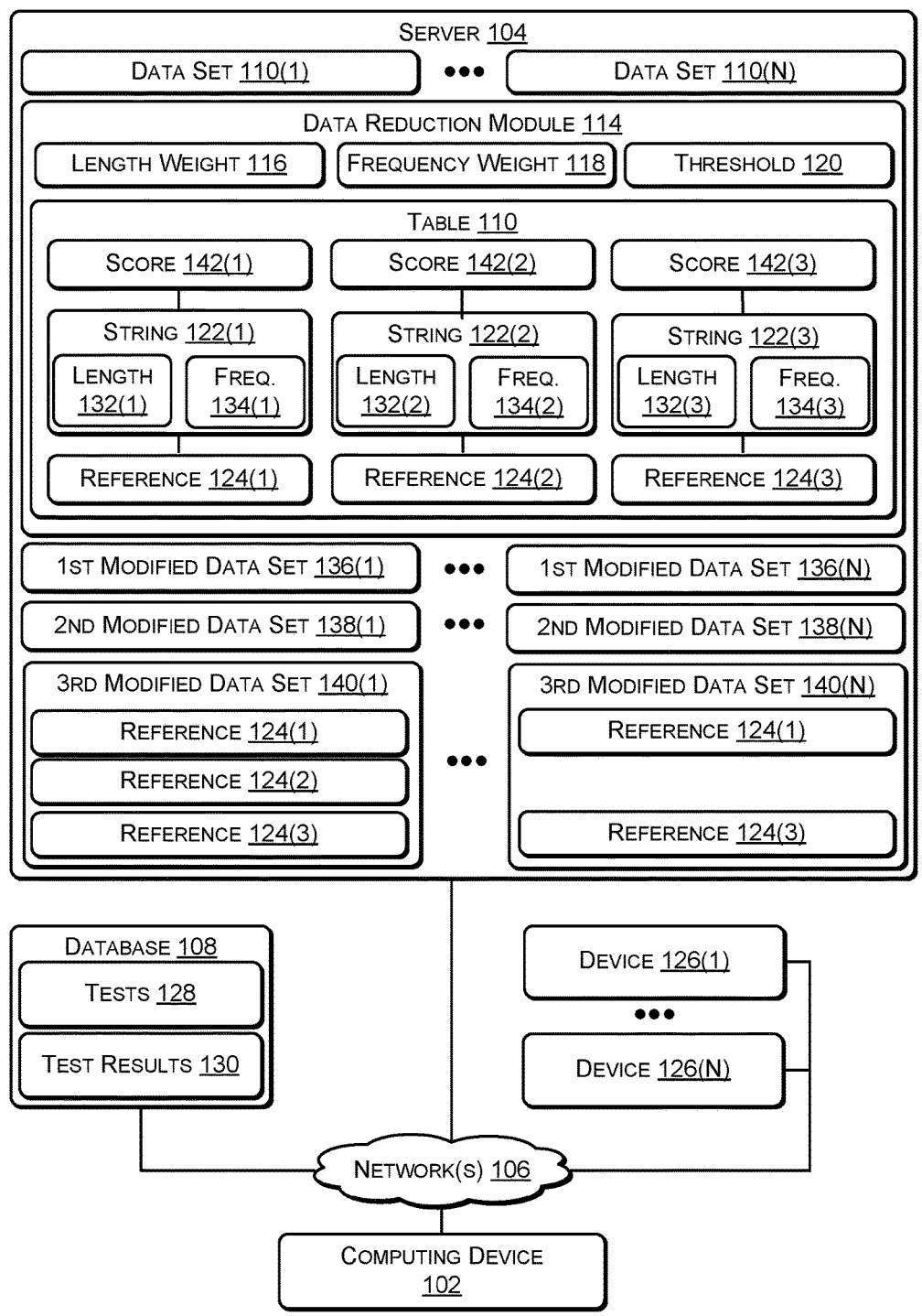
FIG. 1 is a block diagram of a system to reduce a size of multiple data sets, according to some embodiments.

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or video display. The information handling system may also include one or more buses operable to transmit communications between the various hardware components.

The systems and techniques described herein enable data sets stored in a database to be compressed in size, thereby reducing (e.g., by at least about 30%) an amount of storage space used to store the data sets. The amount of data sets stored in the database may increase over time, causing an organization to decide between (1) paying money to acquire (e.g., purchase or lease) more storage or (2) decreasing a length of time for which the data sets are stored (e.g., 3 months of data sets are stored instead of 6 months of data sets). It should be appreciated that the systems and techniques described herein may be used with a variety of different types of databases, including relational, SQL, Oracle®, NoSQL, and the like.

A server that is connected to the database via a network may execute a data reduction module that retrieves multiple data sets, reduces a size of the multiple data sets to create multiple modified data sets, and stores the modified data sets in the database. The network may be connected to one or more devices (e.g. electronic devices that include one or more processors, such as a computing device, a smartphone, a laptop, and the like). For example, a recently manufactured (e.g., new) device may be connected to the network and tested (e.g., prior to being shipped to a customer). The testing may include executing a series of tests to test the functionality of various components (e.g., processor, video processor, storage device, display device, input/output (I/O) and the like) of the device. The series of tests and the data resulting from executing the tests may be stored in the database (e.g., for future usage). The amount of data to be stored may be large and may include repetitive strings (e.g., patterns). Note that test execution patterns (and test results) are merely used as an example of data that may be stored in a database. The systems and techniques described herein may be used on any type of data. It should be noted that data may be stored on any type of storage device, including optical storage devices, solid state devices, hard disk drives, and the like. The systems and techniques described herein may be used to compress the data prior to storing the compressed data on another type of storage device.

The server may select multiple data sets, identify one or more strings (e.g., patterns) that are common to each of the multiple data sets, select a particular string of the one or more strings, and modify the multiple data sets (e.g., to create modified data sets) by replacing each occurrence of the particular string in the multiple data sets with a corresponding reference. The resulting modified data sets may be smaller in size (e.g., at least about 30% depending on how many passes are performed), thereby using less storage space.

The server may retrieve multiple data sets and identify one or more strings (e.g., patterns) that are common to each of the multiple data sets. For example, the server may perform a set intersection to identify one or more strings that are common to two or more of the multiple data sets. In addition to being common to two or more of the multiple data sets, a particular string may be repeated more than once in a particular data set. Thus, a particular string that is common to the multiple data sets may have an associated length (e.g., a number of characters in the particular string) and an associated frequency (e.g., how many times the particular string occurs across the multiple data sets). In some cases, a length weight and a frequency weight may be used to create a weighted score for each string based on a length of each string and how frequently each string occurs across the multiple data sets. The server may select a particular string (e.g., from the one or more strings) that has the highest weighted score. For example, the string with the highest weighted score may result in the largest reduction in size for the multiple data sets. The server may assign a reference (e.g., an alpha-numeric character, a pointer, or another type of reference) to the particular string and store the particular string in a table. The server may replace each occurrence of the string in the multiple data sets with the reference to create multiple modified data sets. A size of the multiple modified data sets may be smaller as compared to an original size of the original (e.g., unmodified) multiple data sets.

The server may repeat the previous process of (i) identifying (e.g., using set intersection) one or more strings (e.g., patterns) common to two or more of the multiple data sets, (ii) selecting a particular string of the one or more strings (e.g., based on a length of the particular pattern and the frequency of occurrence of the particular string), (iii) assigning a reference to the particular string, (iv) adding the reference and the particular string to a table, and (v) replacing each occurrence of the particular string in the multiple data sets with the reference. The server may repeat the process until a predetermined size reduction threshold has been met. For example, the server may repeat the process until at least Y % (e.g., 40%) reduction in size has been achieved. Typically, for certain types of data, a 40% reduction in size may be achieved in three or four passes.

As a simplified example of the data reduction process, assume:
Data Set 1=(1, 2, 3, 4, 7, 8, 10)
Data Set 2=(0, 2, 3, 4, 7, 11)
Data Set 3=(1, 8, 10)

A reference, such as R1, may be a number (e.g., 1, 2, 3, and the like), a letter (e.g., A, B, C, and the like), a symbol (e.g., *, ˆ, ~, and the like), or other short string. In some cases, three to four passes may be performed to achieve a relatively high (e.g., at least 40%) size reduction. For this reason, a single alpha-numeric character may be used as the reference to achieve a significant reduction in size. Of course, references having more than one alpha-numeric character may be used. However, larger references result in a smaller reduction in size.

In this example, the server may identify one or more strings (e.g., patterns) common to the data sets and assign a reference (R1) to a particular string (e.g., based on frequency and length):
R1=2, 3, 4, 7

Each occurrence of string (2, 3, 4, 7) in the multiple data sets may be replaced with R1, resulting in:
first modified Data Set 1=(1, R1, 8, 10)
first modified Data Set 2=(0, R1, 11)
first modified Data Set 3=(1, 8, 10)
Table: (R1=(2, 3, 4, 7))

Thus, after the first pass, each occurrence of string (2, 3, 4, 7) has been replaced with R1.

In a second pass, string (1, 8, 10) is identified as common to at least two of the data sets and assigned a reference R2, added to the table, and each occurrence is replaced with R2, resulting in:
second modified Data Set 1=(R1, R2)
second modified Data Set 2=(0, R1, 11)
second modified Data Set 3=(R2)
Table: (R1=(S2, S3, S4, S7), R2=(S1, S8, S10))

Thus, after the second pass, each occurrence of the string (1, 8, 10) has been replaced with R2. The process may stop when a desired size reduction threshold has been satisfied. In this way, by compressing a size of the multiple data sets, storage costs may be reduced because, for a particular sized data storage device, more data sets can be stored and the data sets may be stored for a longer period of time before being deleted to make room for newer data sets.

As an example, a server may include one or more processors and one or more non-transitory computer readable media storing instructions that executable by one or more processors to perform various operations. The operations may include retrieving a plurality of data sets. For example, each data set may include test execution patterns associated with testing a device, such as a laptop, a desktop, a tablet, a smartphone, or another type of device that includes one or more processors. The operations may include determining a set of strings that are included in two or more data sets of the plurality of data sets. For example, a set intersection of the plurality of data sets may be performed to determine the set of strings that are included in each data set of the plurality of data sets. The operations may include selecting a particular string of the set of strings based in part on a frequency of occurrence of the particular string and a length of the particular string. For example, the particular string of the set of strings may be selected based in part on determining the frequency of occurrence associated with each string of the set of strings, determining the length associated with each string of the set of strings, determining a weighted score of each string of the set of strings based on a sum of: (1) multiplying a frequency weight with the frequency of occurrence of each string and (2) multiplying a length weight with the length of each string, and selecting the particular string from the set of strings based on a highest weighted score. The operations may include replacing each occurrence of the particular string, in each of the data sets, with a reference to create a plurality of modified data sets. For example, a reference may be associated with the particular string. The reference may include at least one alpha-numeric character. The operations may include replacing each occurrence of the particular string in each data set with the reference and storing the particular string and the associated reference in a table. A size of the plurality of modified data sets may be smaller than a size of the plurality of data sets. The operations may include determining a second set of strings that are included in each data set of the plurality of modified data sets, selecting a second particular string of the second set of strings, and replacing each occurrence of the second particular string in each modified data set of the plurality of modified data sets to create a second plurality of modified data sets. A size of the second plurality of modified data sets is smaller than a size of the plurality of modified data sets.

FIG. 1 is a block diagram of a system 100 to reduce a size of multiple data sets, according to some embodiments. A computing device 102 may be connected to a server 104 (e.g., a virtual server or a physical server) via a network 106. A database 108 may be connected to the server 104 via the network 106. The network 106 may be connected to one or more devices 126(1) to 126(N) (N>0) that are to be tested.

For example, the devices 126 may include any type of device that includes a processor, such as, for example, a laptop, a desktop, a smartphone, a smartwatch, or another type of device. The computing device 102 may be used to access the database 108. For example, the computing device 102 may automatically (e.g., without human interaction) execute one or more tests 128 stored in the database 108 to test one or more of the devices 126. Test results 130 resulting from performing one or more of the tests 128 (e.g., test execution patterns) to the devices 126 may be stored in the database 108. The database 108 may be an SQL database, an Oracle® database, a NoSQL database, or the like.

The server 104 may include a data reduction module 114 to reduce a size of multiple data sets (e.g., the tests 128, the rests results 130, or the like) stored in the database 108. The server 104 may retrieve a plurality of data sets 110(1) to 110(N) (e.g., the tests 128, the test results 130, or the like) from the database 108. For example, the data sets 110(1) to 110(N) may represent test execution patterns (e.g., the tests 128) used to test various subcomponents of the devices 126(1) to 126(N). For example, when the devices 126 include a laptop computer, a first test execution pattern may test video components, a second test execution pattern may test the storage drive, a third test execution pattern may test the input/output (I/O) ports, and the like. Because there are multiple devices 126 and each of the devices 126 has multiple subcomponents, the amount of storage required to store the tests 128 (e.g., test execution patterns) may be large. While FIG. 1 illustrates reducing a size of the plurality of data sets 110(1) to 110(N) that include test execution patterns, the systems and techniques described herein may be applied to reducing the size of any types of data sets and are not restricted to test execution patterns.

The server 104 may execute a data reduction module 114 to reduce a size of the data sets 110(1) to 110(N). For example, the data reduction module 114 may identify one or more strings (e.g., patterns) that are included in each of the data sets 110, select one of the strings, assign a reference to the selected string, store the selected string and the reference in a table, and replace each occurrence of the string in the data sets 110 with the reference. Each entry in each of the data sets 110 may represent a separate test activity in a factory test process.

The data reduction module 114 may retrieve the data sets 110(1) to 110(N) from the database 108 and identify one or more strings, such as strings 122(1), 122(2), and 122(3), that are included in (e.g., common to) two or more of the data sets 110(1) to 110(N). Three strings 122(1), 122(2), 122(3) are used purely for illustration purposes and more than three or fewer than three strings may be identified depending on the contents of the data sets 110. The data reduction module 114 may, for example, perform a set intersection of the contents of each of the data sets 110 to identify the strings 122 that are common to two or more of the data sets 110. In some cases, the data reduction module 114 may determine a length of each of the strings 122 and a frequency of occurrence of each of the strings 122. For example, the string 122(1) may have a length 132(1) and a frequency 134(1), the string 122(2) may have a length 132(2) and a frequency 134(2), and the string 122(3) may have a length 132(3) and a frequency 134(3).

In some cases, the data reduction module 114 may apply a length weight 116 to the lengths 132 of each of the strings 122 and apply a frequency weight 118 to the frequency of occurrence 134 of each of the frequencies 134 to determine a weighted score for each of the strings 122. For example, data reduction module 114 may determine a score 142(1) for the string 122(1), a score 142(2) for the string 122(2), and a score 142(3) for the string 122(3). The data reduction module 114 may select a particular one of the strings 122 based on the associated lengths 132 and the associated frequencies 134. For example, if the scores 142 are used, the data reduction module 114 may select a particular one of the strings 122 having the highest weighted score. The weighted score 142 for each of the strings 122 may be determined as follows:

Score 142(N)=(length weight 116×length 132(N))+ (frequency weight 118×frequency 134(N))

In a first pass, the data reduction module 114 may identify a string 122(1) as being included in two or more of the data sets 110. The data reduction module 114 may select the string 122(1) based on the associated length 132(1) and the associated frequency 134(1) or based on the weighted score. The data reduction module 114 may assign a reference, e.g., reference 124(1) to the string 122(1) and store the string 122(1) and the corresponding reference 124(1) in the table 110. Data reduction module 114 may replace each occurrence of the string 122(1) in the data sets 110(1) to 110(N) with the reference 124(1) to create first modified data sets 136(1) to 136(N), respectively. A size of the first modified data sets 136 may be smaller than a size of the data sets 110.

In a second pass, the data reduction module 114 may identify strings 122(2) as being included in two or more of the data sets 110. The data reduction module 114 may select the string 122(2) based on the associated length 132(2) and the associated frequency 134(2) or based on the weighted score. The data reduction module 114 may assign a reference, e.g., reference 124(2) to the string 122(2) and store the string 122(2) and the corresponding reference 124(2) in the table 110. Data reduction module 114 may replace each occurrence of the string 122(2) in the data sets 110(1) to 110(N) with the reference 124(2) to create second modified data set 138(1) to 138(N), respectively. A size of the second modified data sets 138 may be smaller than a size of the first modified data sets 136 and of the data sets 110.

In a third pass, the data reduction module 114 may identify string 122(3) as being included in two or more of the data sets 110. The data reduction module 114 may select the string 122(3) based on the associated length 132(3) and the associated frequency 134(3) or based on the weighted score. The data reduction module 114 may assign a reference, e.g., reference 124(3) to the string 122(3) and store the string 122(3) and the corresponding reference 124(3) in the table 110. Data reduction module 114 may replace each occurrence of the string 122(3) in the data sets 110(1) to 110(N) with the reference 124(3) to create third modified data set 140(1) to 140(N), respectively. A size of the third modified data sets 140 may be smaller than a size of the second modified data sets 138. Thus:

size(third modified data sets 140)<size(second modified data sets 138)<size(first modified data sets 136)<size(data sets 110)

Thus, after three passes (e.g., iterations), the data sets 140 may include at least one of (i) the reference 124(1) where the string 122(1) had been located, (ii) the reference 124(2) where the string 122(2) had been located, or (iii) the reference 124(3) where the string 122(3) had been located (e.g., in the data sets 110). A size of the third modified data sets 140 may be significantly smaller compared to a size of the data sets 110.

After each pass, the data reduction module 114 may determine whether a percentage of reduction in size of the resulting data sets (e.g., the modified data sets 136, 138, 140) relative to the data sets 110 satisfies a predetermined threshold 120. Thus, while the results of three passes are illustrated in FIG. 1, depending on the data sets 110 and the threshold 120, the data reduction module 114 may perform fewer than three passes or more than three passes. When the data reduction module 114 determines that the size reduction of the resulting data sets (e.g., the modified data sets 136, 138, 140) relative to the data sets 110 satisfies the predetermined threshold 120, then the compression process may stop. The data reduction module 114 may replace the data sets 110 (e.g., at least a portion of the test 128) with a modified data set, such as the third modified data set 140 (e.g., assuming three passes are performed), in the database 108. The data reduction module 114 may store the table 110 with the modified data set (e.g., the third modified data set 140) in the database 108. In this way, the modified data set (e.g., the third modified data set 140) takes up significantly less storage space in the database 108 as compared to the data sets 110.

Thus, a server may retrieve multiple data sets from a database, identify one or more strings (e.g., patterns) that are included in two or more data set of the multiple data sets, select a particular string based on a length of the particular string and a frequency of occurrence of the particular string, assign a reference to the particular string, store the reference and the particular string in a table, and replace each occurrence of the particular string in the multiple data sets with the reference to create multiple modified data sets. The server may repeat the process with the modified data sets until a predetermined threshold percentage (or size) reduction has been achieved, e.g., a size of the modified data sets is at least a threshold percentage (or amount) smaller than a size of the original multiple data sets. The modified data sets may be stored, with the associated table, in the database. The modified data sets may replace the original data sets in the database, enabling a significant (e.g., at least 40%) reduction in size, thereby reducing the amount of storage used and the associated costs. In this way, for example, the modified (e.g., compressed) data sets can be stored for a longer period of time without acquiring additional storage capacity.

Figure 2:
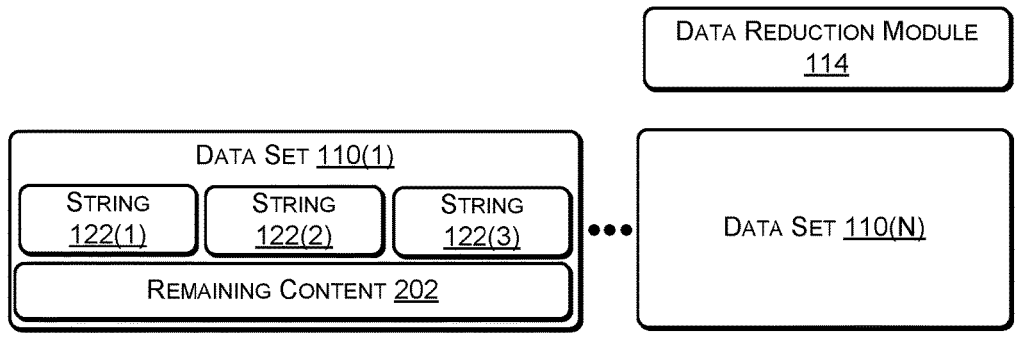
FIG. 2 is a block diagram illustrating multiple passes to reduce a size of a data set, according to some embodiments.
Figure 2:
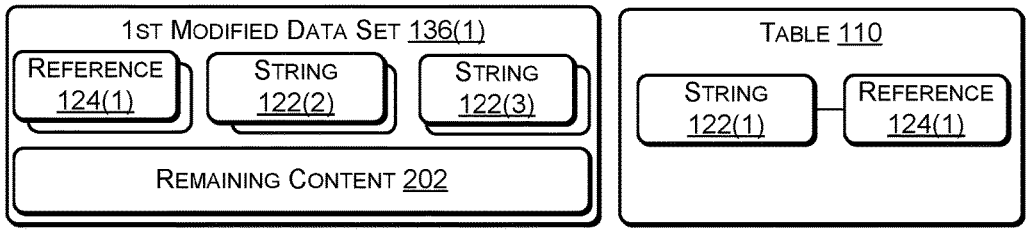
Figure 2:
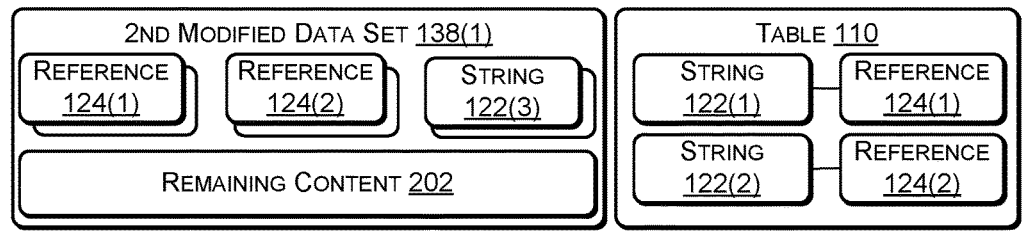
Figure 2:
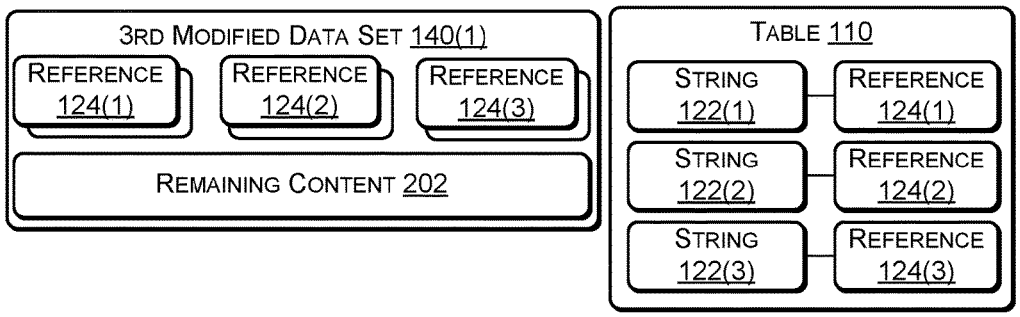

FIG. 2 is a block diagram 200 illustrating multiple passes to reduce a size of a data set, according to some embodiments. For illustration purposes, the contents of a particular data set (e.g., the data set 110(1)) and the table 110 are shown after each of multiple passes. In FIG. 2, the data set 110(1) includes the strings 122(1), 122(2), 122(3), and remaining content 202.

During a first pass 200A, the server may determine that the strings 122(1), 122(2), 122(3) are common to two or more of the data sets 110(1) to 110(N). The data reduction module 114 may select the string 122(1) on the length of the string 122(1), based on the frequency of string 122(1), or both. In some cases, the data reduction module 114 may select the string 122(1) based on the length and the frequency of the string 122(1). The data reduction module 114 may assign the reference 124(1) to the string 122(1) and store the reference 124(1) and the string 122(1) in the table 110. The data reduction module 114 may replace each occurrence of the string 122(1) with the reference 124(1) in each of the data sets 110. For example, the data reduction module 114 may replace each occurrence of the string 122(1) with the reference 124(1) in the data set 110(1) to create the first modified data set 136(1). Thus, after the first pass 200A is completed, the first modified data set 136(1) includes the reference 124(1), the string 122(2), the string 122(3), and the remaining content 202. After the first pass 200A is completed, the table 110 includes the string 122(1)

and the reference 124(1). The first modified data set 136(1) is smaller in size than the data set 110(1) because each occurrence of the string 122(1) has been replaced with the reference 124(1).

During a second pass 200B, the server may determine that the string 122(2) is common to two or more of the data sets 110(1) to 110(N). The data reduction module 114 may select the string 122(2) based on the length and the frequency of the string 122(2). The data reduction module 114 may assign the reference 124(2) to the string 122(2) and store the reference 124(2) and the string 122(2) in the table 110. The data reduction module 114 may replace each occurrence of the string 122(2) with the reference 124(2) in each of the data sets 110. For example, the data reduction module 114 may replace each occurrence of the string 122(2) with the reference 124(2) in the first modified data set 136(1) to create the second modified data set 138(1). Thus, after the second pass 200B is completed, the second modified data set 136(1) includes the reference 124(1), the reference 124(2), the string 122(3), and the remaining content 202. After the second pass 200B is completed, the table 110 includes the string 122(1), the reference 124(1), the string 122(2), and the reference 124(2). The second modified data set 138(1) is smaller in size than the first modified data set 136(1) because each occurrence of the string 122(2) has been replaced with the reference 124(2).

During a third pass 200C, the server may determine that the string 122(3) is common to two or more of the data sets 110(1) to 110(N). The data reduction module 114 may select the string 122(3) based on the length of the string 122(3), based on the frequency of string 122(3), or both. In some cases, the data reduction module 114 may determine a weighted score and select the string 122(3) having the highest weighted score. The data reduction module 114 may assign the reference 124(3) to the string 122(3) and store the reference 124(3) and the string 122(3) in the table 110. The data reduction module 114 may replace each occurrence of the string 122(3) with the reference 124(3) in each of the data sets 110. For example, the data reduction module 114 may replace each occurrence of the string 122(3) with the reference 124(3) in the second modified data set 138(1) to create the third modified data set 140(1). Thus, after the third pass 200C is completed, the third modified data set 140(1) includes the reference 124(1), the reference 124(2), the reference 124(3), and the remaining content 202. After the third pass 200C is completed, the table 110 includes the string 122(1), the reference 124(1), the string 122(2), the reference 124(2), the string 122(3), and the reference 124(3). The third modified data set 140(1) is smaller in size than the second modified data set 138(1) because each occurrence of the string 122(3) has been replaced with the reference 124(3).

In this way, multiple data sets may be modified by performing successive passes to replace a common strong with a reference until a desired amount (or percentage) of size reduction is achieved. The three passes 200A, 200B, 200C show in FIG. 2 are purely for illustration purposes. Depending on the content of the data sets 110, more than three passes or less than three passes may be performed.

Thus, a server may identify one or more strings that are included in (e.g., common to) each data set of multiple data sets, select a particular string based on a length of the particular string and a frequency of occurrence of the particular string, assign a reference to the particular string, store the reference and the particular string in a table, and replace each occurrence of the particular string in each of the multiple data sets with the reference to create multiple modified data sets. The server may repeat the process with the modified data sets until a predetermined threshold percentage (or size) reduction has been achieved, e.g., the modified data sets are at least a threshold percentage (or amount) smaller than the original multiple data sets. The modified data sets may be stored, with the associated table, in the database. The modified data sets may replace the original multiple data sets in the database, enabling a significant (e.g., at least 40%) reduction in size, thereby reducing the amount of storage used and the associated costs. In this way, for example, the modified (e.g., compressed) data sets may be stored for a longer period of time without acquiring additional storage capacity.

Figure 3:
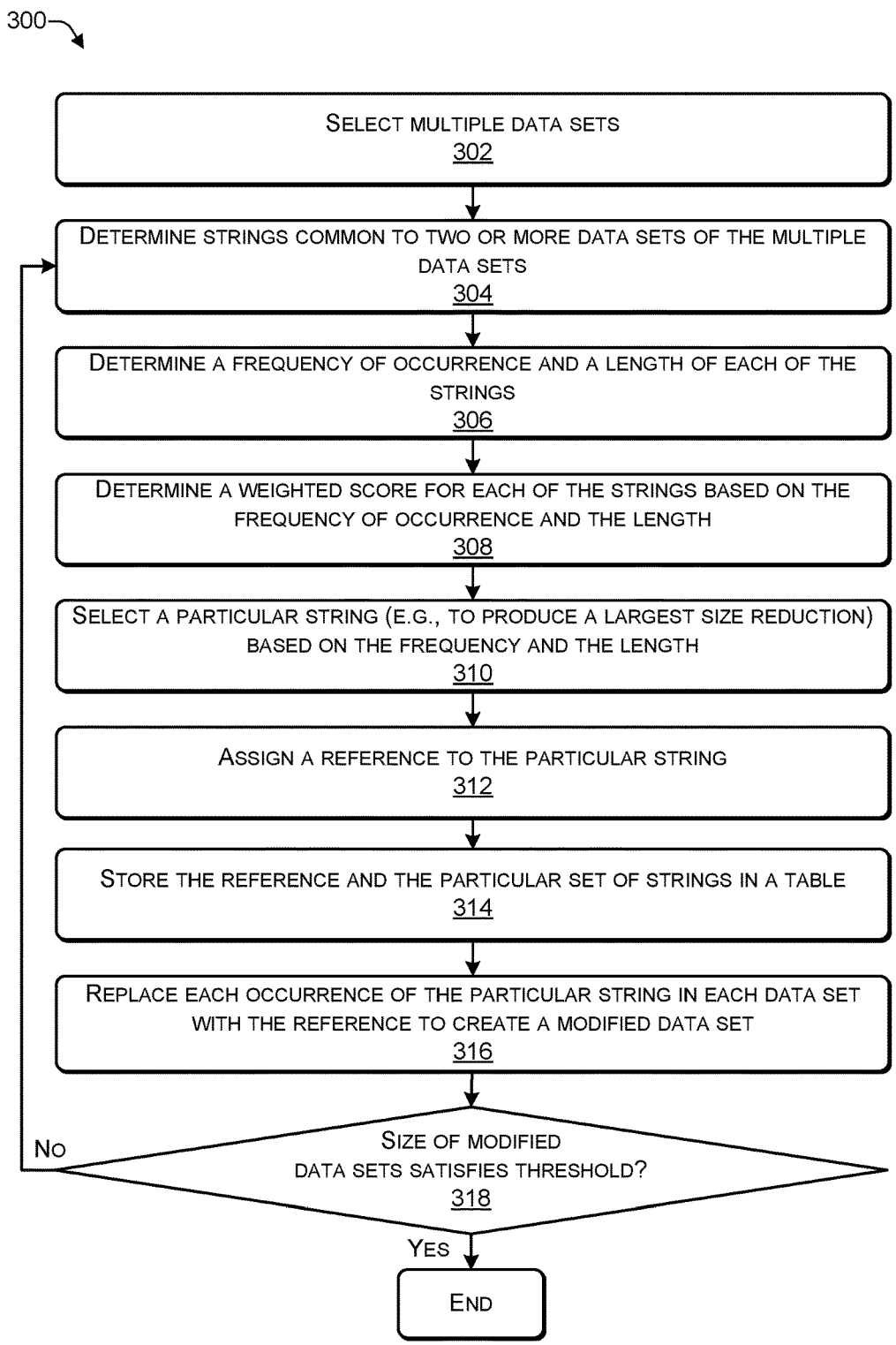
FIG. 3 is a flowchart of a process that includes replacing each occurrence of a particular string with a reference in multiple data sets, according to some embodiments.

In the flow diagram of FIG. 3, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the process 300 is described with reference to FIGS. 1 and 2, as described above, although other models, frameworks, systems and environments may be used to implement these processes.

FIG. 3 is a flowchart of a process 300 that includes replacing each occurrence of a particular string with a reference in multiple data sets, according to some embodiments. For example, the process 300 may be performed by the server 104 of FIG. 1.

At 302, multiple data sets may be selected (e.g., retrieved from a database). At 304, one or more strings common to two or more data sets of the multiple data sets may be determined (e.g., by determining an intersection of the multiple data sets). At 306, a frequency of occurrence and a length of each of the one or more strings may be determined. At 308, a weighted score for each string using the frequency of occurrence and the length of each string may be determined. For example, in FIG. 1, the server 104 may retrieve the data sets 110 from the database 108. The server 104 may determine that the strings 122 are included in (e.g., common to) each of the data sets 110. The server 104 may determine that the string 122(1) has the associated length 132(1) and associated frequency 134(1), the string 122(2) has the associated length 132(2) and associated frequency 134(2), and the string 122(3) has the associated length 132(3) and associated frequency 134(3). In some cases, the server 104 may use the length weight 116 and the frequency weight 118 along with the lengths 132 and the frequencies 134 to determine the weighted scores 142 for each of the strings 122.

At 310, a particular string may be selected (e.g., to produce a largest size reduction in the multiple data sets) based on the frequency and the length of each string. At 312, a reference may be assigned to the particular string. At 314, the reference and the particular string may be stored in a table. At 316, each occurrence of the particular string in each data set may be replaced with the reference to create a modified data set. For example, in FIG. 2, in the first pass 200A, the string 122(1) may be selected, assigned the reference 124(1), and the string 122(1) and the reference 124(1) may be stored in the table 110. The data reduction module 114 may replace each occurrence of the selected string 122(1) with the reference 124(1) in each of the data sets 110 to create the first modified data sets 136.

At 318, a determination may be made if the size of the modified data sets satisfies a size reduction threshold. If a determination is made, at 318, that "yes" the size of the modified data sets satisfies the size reduction threshold (e.g., the size of the modified data sets is at least X % smaller in size than the data sets, where X>0), then the process may end. If a determination is made, at 318, that "no" the size of the modified data sets does not satisfy the size reduction threshold (e.g., the size of the modified data sets is not X % smaller in size than the data sets, where X>0), then the process may proceed to 304 and a subsequent pass may be performed.

Thus, a server may identify one or more strings that are included in (e.g., common to) two or more data sets of multiple data sets, select a particular string based on a length of the particular string and a frequency of occurrence of the particular string, assign a reference to the particular string, store the reference and the particular string in a table, and replace each occurrence of the particular string in each of the multiple data sets with the reference to create multiple modified data sets. The server may repeat the process with the modified data sets until a predetermined threshold percentage (or size) reduction has been achieved, e.g., the modified data sets are at least a threshold percentage (or amount) smaller than the original multiple data sets, thereby reducing storage costs and increasing the amount of data sets that can be stored.

Figure 4:
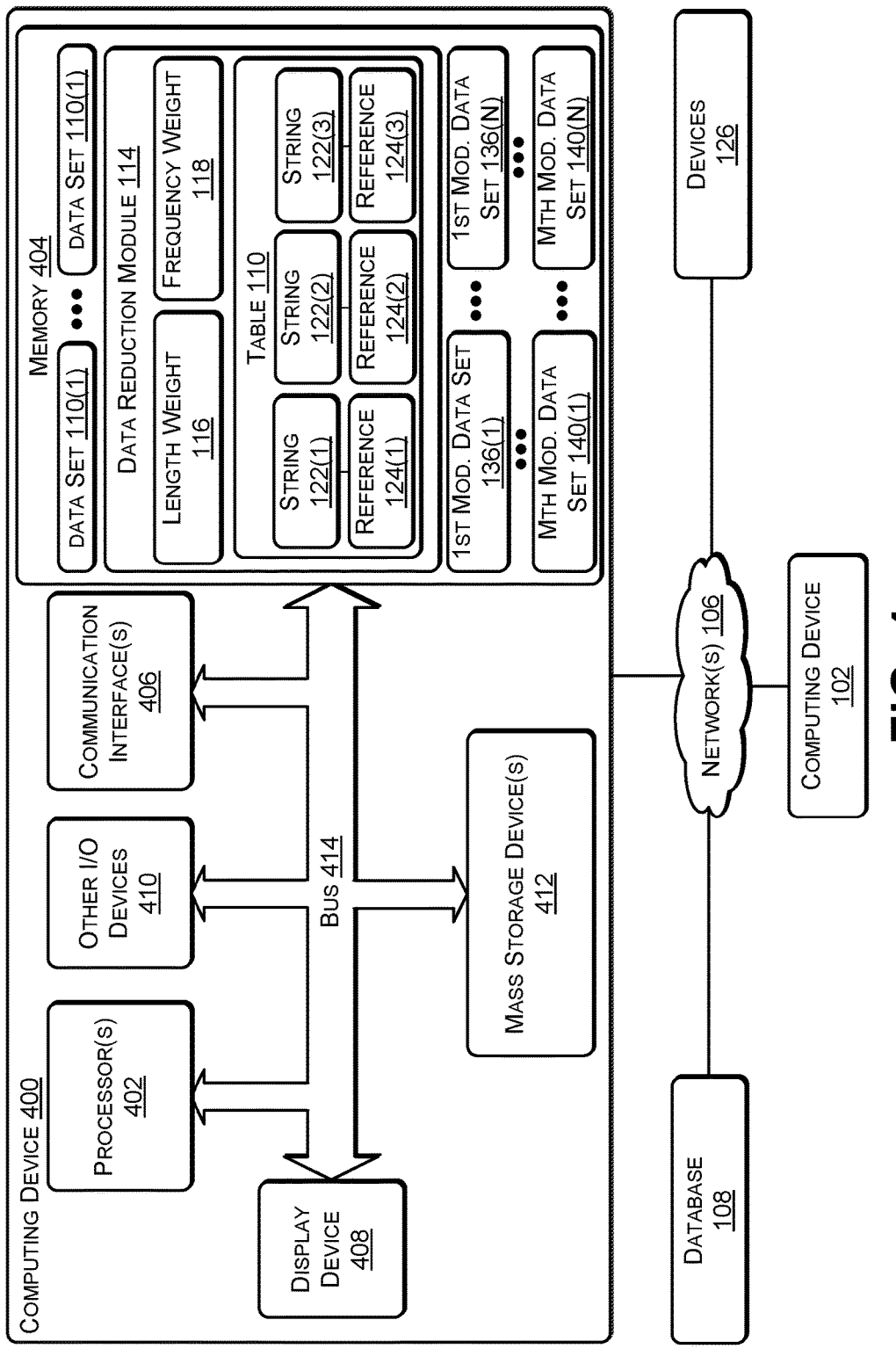
FIG. 4 illustrates an example configuration of a computing device that can be used to implement the systems and techniques described herein.

FIG. 4 illustrates an example configuration of a computing device 400 that can be used to implement the systems and techniques described herein, such as for example, the computing device 102, the devices 126, and the server 104 of FIG. 1. For illustration purposes, the computing device 400 is shown in FIG. 4 as implementing the server 104 of FIG. 1.

The computing device 400 may include one or more processors 402 (e.g., CPU, GPU, or the like), a memory 404, communication interfaces 406, a display device 408, other input/output (I/O) devices 410 (e.g., keyboard, trackball, and the like), and one or more mass storage devices 412 (e.g., disk drive, solid state disk drive, or the like), configured to communicate with each other, such as via one or more system buses 414 or other suitable connections. While a single system bus 414 is illustrated for ease of understanding, it should be understood that the system buses 414 may include multiple buses, such as a memory device bus, a storage device bus (e.g., serial ATA (SATA) and the like), data buses (e.g., universal serial bus (USB) and the like), video signal buses (e.g., ThunderBolt®, DVI, HDMI, and the like), power buses, etc.

The processors 402 are one or more hardware devices that may include a single processing unit or a number of processing units, all of which may include single or multiple computing units or multiple cores. The processors 402 may include a graphics processing unit (GPU) that is integrated into the CPU or the GPU may be a separate processor device from the CPU. The processors 402 may be implemented as one or more microprocessors, microcomputers, microcontrollers, digital signal processors, central processing units, graphics processing units, state machines, logic circuitries, and/or any devices that manipulate signals based on operational instructions. Among other capabilities, the processors 402 may be configured to fetch and execute computer-readable instructions stored in the memory 404, mass storage devices 412, or other computer-readable media.

Memory 404 and mass storage devices 412 are examples of computer storage media (e.g., memory storage devices) for storing instructions that can be executed by the processors 402 to perform the various functions described herein. For example, memory 404 may include both volatile memory and non-volatile memory (e.g., RAM, ROM, or the like) devices. Further, mass storage devices 412 may include hard disk drives, solid-state drives, removable media, including external and removable drives, memory cards, flash memory, floppy disks, optical disks (e.g., CD, DVD), a storage array, a network attached storage, a storage area network, or the like. Both memory 404 and mass storage devices 412 may be collectively referred to as memory or computer storage media herein and may be any type of non-transitory media capable of storing computer-readable, processor-executable program instructions as computer program code that can be executed by the processors 402 as a particular machine configured for carrying out the operations and functions described in the implementations herein.

The computing device 400 may include one or more communication interfaces 406 for exchanging data via the network 106. The communication interfaces 406 can facilitate communications within a wide variety of networks and protocol types, including wired networks (e.g., Ethernet, DOCSIS, DSL, Fiber, USB etc.) and wireless networks (e.g., WLAN, GSM, CDMA, 802.11, Bluetooth, Wireless USB, ZigBee, cellular, satellite, etc.), the Internet and the like. Communication interfaces 406 can also provide communication with external storage, such as a storage array, network attached storage, storage area network, cloud storage, or the like.

The display device 408 may be used for displaying content (e.g., information and images) to users. Other I/O devices 410 may be devices that receive various inputs from a user and provide various outputs to the user, and may include a keyboard, a touchpad, a mouse, a printer, audio input/output devices, and so forth.

The computer storage media, such as memory 116 and mass storage devices 412, may be used to store software and data. For example, the computer storage media may be used to store the data reduction module 114, the table 110, and the modified data sets 136 to 140.

The example systems and computing devices described herein are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (e.g., fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (e.g., CPUs or processors). The program code can be stored in one or more computer-readable memory devices or other computer storage devices. Thus, the processes, components and modules described herein may be implemented by a computer program product.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method comprising:
   selecting, by one or more processors, a plurality of data sets;
   performing, by the one or more processors, a set intersection of the plurality of data sets;
   determining, by the one or more processors and based on the set intersection of the plurality of data sets, a set of strings that are included in at least two data sets of the plurality of data sets;
   selecting, by the one or more processors, a particular string of the set of strings based in part on a frequency of occurrence of the particular string and a length of the particular string; and
   replacing, by the one or more processors, each occurrence of the particular string in the plurality of data sets to create a plurality of modified data sets, wherein the plurality of modified data sets is smaller in size than the plurality of data sets.

2. The method of claim 1, further comprising:
   determining a second set of strings that are included in the plurality of modified data sets;
   selecting a second particular string of the second set of strings; and
   replacing each occurrence of the second particular string in the plurality of modified data sets to create a second plurality of modified data sets, wherein the second plurality of modified data sets is smaller in size than the plurality of modified data sets.

3. The method of claim 1, wherein selecting the particular string of the set of strings comprises:
   determining the frequency of occurrence associated with each string of the set of strings;
   determining the length associated with each string of the set of strings;
   determining a weighted score of each string of the set of strings based on a sum of:
     multiplying a frequency weight with the frequency of occurrence of each string; and
     multiplying a length weight with the length of each string;
   selecting the particular string from the set of strings based on a highest weighted score.

4. The method of claim 1, wherein replacing each occurrence of the particular string in the plurality of data sets to create the plurality of modified data sets comprises:
   associating a reference with the particular string;
   replacing each occurrence of the particular string in the plurality of data sets with the reference; and
   storing the particular string and the associated reference in a table.

5. The method of claim 4, wherein the reference comprises at least one alpha-numeric character.

6. The method of claim 1, wherein each data set corresponds to test execution patterns associated with testing a device.

7. The method of claim 1, further comprising:
   determining that a size of the plurality of modified data sets satisfies a predetermined threshold; and
   not modifying further the plurality of modified data sets.

8. A computing device comprising:
   one or more processors; and
   one or more non-transitory computer readable media storing instructions executable by the one or more processors to perform operations comprising:
     retrieving a plurality of data sets;
     performing a set intersection of the plurality of data sets;
     determining, based on the set intersection of the plurality of data sets, a set of strings that are included in at least two data sets of the plurality of data sets;
     selecting a particular string of the set of strings based at least in part on a frequency of occurrence of the particular string and a length of the particular string; and
     replacing each occurrence of the particular string in the plurality of data sets to create a plurality of modified data sets, wherein the plurality of modified data sets is smaller in size than the plurality of data sets.

9. The computing device of claim 8, wherein the operations further comprise:
   determining a second set of strings that are included in the plurality of modified data sets;
   selecting a second particular string of the second set of strings; and
   replacing each occurrence of the second particular string in the plurality of modified data sets to create a second plurality of modified data sets, wherein the second plurality of modified data sets is smaller in size than the plurality of modified data sets.

10. The computing device of claim 8, wherein selecting the particular string of the set of strings comprises:
    determining the frequency of occurrence associated with each string of the set of strings;
    determining the length associated with each string of the set of strings;
    determining a weighted score of each string of the set of strings based on a sum of:
      multiplying a frequency weight with the frequency of occurrence of each string; and
      multiplying a length weight with the length of each string;
    selecting the particular string from the set of strings based on a highest weighted score.

11. The computing device of claim 8, wherein replacing each occurrence of the particular string in the plurality of data sets to create the plurality of modified data sets comprises:
    associating a reference with the particular string;

replacing each occurrence of the particular string in the plurality of data sets with the reference; and storing the particular string and the associated reference in a table.

12. The computing device of claim 11, wherein the reference comprises at least one alpha-numeric character.

13. The computing device of claim 8, wherein each data set corresponds to test execution patterns associated with testing a device.

14. One or more non-transitory computer readable media storing instructions executable by one or more processors to perform operations comprising:

retrieving a plurality of data sets;

performing a set intersection of the plurality of data sets;

determining, based on the set intersection of the plurality of data sets, a set of strings that are included in at least two data set of the plurality of data sets;

selecting a particular string of the set of strings based in part on a frequency of occurrence of the particular string and a length of the particular string; and replacing each occurrence of the particular string in the plurality of data sets to create a plurality of modified data sets, wherein the plurality of modified data sets is smaller in size than the plurality of data sets.

15. The one or more non-transitory computer readable media of claim 14, wherein the operations further comprise:

determining a second set of strings that are included in the plurality of modified data sets;

selecting a second particular string of the second set of strings; and replacing each occurrence of the second particular string in the plurality of modified data sets to create a second plurality of modified data sets, wherein the second plurality of modified data sets is smaller in size than the plurality of modified data sets.

16. The one or more non-transitory computer readable media of claim 14, wherein the operations of selecting the particular string of the set of strings further comprises:

determining the frequency of occurrence associated with each string of the set of strings;

determining the length associated with each string of the set of strings;

determining a weighted score of each string of the set of strings based on a sum of:

multiplying a frequency weight with the frequency of occurrence of each string; and multiplying a length weight with the length of each string;

selecting the particular string from the set of strings based on a highest weighted score.

17. The one or more non-transitory computer readable media of claim 14, wherein replacing each occurrence of the particular string in the plurality of modified data sets comprises:

associating a reference with the particular string;

replacing each occurrence of the particular string in the plurality of data sets with the reference; and storing the particular string and the associated reference in a table.

18. The one or more non-transitory computer readable media of claim 17, wherein the reference comprises at least one alpha-numeric character.

19. The one or more non-transitory computer readable media of claim 14, wherein each data set corresponds to test execution patterns associated with testing a device.

20. The one or more non-transitory computer readable media of claim 14, further comprising:

determining that a size of the plurality of modified data sets satisfies a predetermined threshold; and not modifying further the plurality of modified data sets.

\* \* \* \* \*